US012771365B2

(12) United States Patent
Bommireddipalli

(10) Patent No.: US 12,771,365 B2
(45) Date of Patent: Oct. 20, 2026

(54) OUTPUT STAGE OF A DIGITAL TO ANALOG CONVERTER

(71) Applicant: Texas Instruments Incorporated, Dallas, TX (US)

(72) Inventor: Aditya Vighnesh Ramakanth Bommireddipalli, Tuscon, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 133 days.

(21) Appl. No.: 18/955,512

(22) Filed: Nov. 21, 2024

(65) Prior Publication Data

US 2026/0142669 A1 May 21, 2026

(51) Int. Cl.
*H03M 1/10* (2006.01)
*H03F 3/217* (2006.01)

(52) U.S. Cl.
CPC ........ *H03M 1/1023* (2013.01); *H03F 3/2175* (2013.01); *H03F 2203/45288* (2013.01)

(58) Field of Classification Search
CPC ................ H03M 1/1023; H03F 3/2175; H03F 2203/45288
See application file for complete search history.

(56) References Cited

U.S. PATENT DOCUMENTS 11,349,439 B2 * 5/2022 Michel .................. H03M 1/403
11,522,510 B2 * 12/2022 Saavedra .............. H03F 3/3033

OTHER PUBLICATIONS

Analog Devices, "Quad Parametric Measurement Unit with Integrated 16-Bit Level Setting DACs" Datasheet AD5522, 64 pages.

* cited by examiner

*Primary Examiner* — Khai M Nguyen
(74) *Attorney, Agent, or Firm* — Xianghui Huang; Frank D. Cimino

(57) ABSTRACT

An example apparatus includes a first transconductance amplifier; an amplifier, the first input of the amplifier coupled to a first output of the first transconductance amplifier, the second input of the amplifier coupled to a second output of the first transconductance amplifier; a resistor, a first terminal of the resistor coupled to an output of the amplifier; and a second transconductance amplifier, a first input of the second transconductance amplifier coupled to a second terminal of the resistor, a second input of the second transconductance amplifier coupled to the output of the amplifier and the first terminal of the resistor, a first output of the second transconductance amplifier coupled to the first output of the first transconductance amplifier and the first input of the amplifier, a second output of the second transconductance amplifier coupled to the second output of the first transconductance amplifier and the second input of the amplifier.

20 Claims, 6 Drawing Sheets

700

OUTPUT STAGE OF A DIGITAL TO ANALOG CONVERTER

TECHNICAL FIELD

This description relates generally to amplifiers, and, more particularly, to an output stage of a digital-to-analog converter.

BACKGROUND

In electrical systems, control circuitry, such as a controller, processor, state machine, etc. may generate a digital control signal. Such electrical systems may include industrial automation systems, irrigation systems, automotive systems, building automation systems, etc. Such systems include a digital-to-analog converter to convert the digital signal to an analog signal and an output stage to provide an analog voltage or current based on the generated analog signal. The analog current or voltage is transmitted to one or more devices, such as peripheral devices, field devices, sensors, valves, actuators, etc. The one or more devices perform one or more actions or operations based on the analog current or voltage.

SUMMARY

For an output stage of a digital-to-analog converter, an example apparatus includes a first transconductance amplifier having a first output and a second output. The apparatus also includes an amplifier having a first input, a second input, and an output, the first input of the amplifier coupled to the first output of the first transconductance amplifier, the second input of the amplifier coupled to the second output of the first transconductance amplifier. The apparatus also includes a resistor having a first terminal and a second terminal, the first terminal of the resistor coupled to the output of the amplifier. The apparatus also includes a second transconductance amplifier having a first input, a second input, a first output, and a second output, the first input of the second transconductance amplifier coupled to the second terminal of the resistor, the second input of the second transconductance amplifier coupled to the output of the amplifier and the first terminal of the resistor, the first output of the second transconductance amplifier coupled to the first output of the first transconductance amplifier and the first input of the amplifier, the second output of the second transconductance amplifier coupled to the second output of the first transconductance amplifier and the second input of the amplifier. Other examples are described.

For an output stage of a digital-to-analog converter, an example apparatus includes a positive voltage supply terminal. The apparatus also includes a negative voltage supply terminal. The apparatus also includes a first transconductance amplifier having a first output and a second output. The apparatus also includes an amplifier having a first input, a second input, and an output, the first input of the amplifier coupled to the first output of the first transconductance amplifier, the second input of the amplifier coupled to the second output of the first transconductance amplifier. The apparatus also includes a resistor having a first terminal and a second terminal, the first terminal of the resistor coupled to the output of the amplifier. The apparatus also includes a second transconductance amplifier having a first input, a second input, a first output, and a second output, the first input of the second transconductance amplifier coupled to the second terminal of the resistor and the positive voltage supply terminal, the second input of the second transconductance amplifier coupled to the negative voltage supply terminal, the first output of the second transconductance amplifier coupled to the first output of the first transconductance amplifier and the first input of the amplifier, the second output of the second transconductance amplifier coupled to the second output of the first transconductance amplifier and the second input of the amplifier. Other examples are described.

For an output stage of a digital-to-analog converter, an example apparatus includes a first switch having a first terminal and a second terminal. The apparatus also includes a second switch having a first terminal and a second terminal. The apparatus also includes a third switch having a first terminal and a second terminal. The apparatus also includes a fourth switch having a first terminal and a second terminal. The apparatus also includes a fifth switch having a first terminal and a second terminal, the second terminal coupled to a common terminal. The apparatus also includes a first transconductance amplifier having a first output and a second output, the first output of the first transconductance amplifier coupled to the second terminal of the second switch and the second terminal of the third switch, the second output of the first transconductance amplifier coupled to the second terminal of the first switch and the second terminal of the fourth switch. The apparatus also includes an amplifier having a first input, a second input, and an output, the first input of the amplifier coupled to the first output of the first transconductance amplifier, second terminal of the second switch, and the second terminal of the third switch, the second input of the amplifier coupled to the second output of the first transconductance amplifier, the second terminal of the first switch, and the second terminal of the fourth switch. The apparatus also includes a resistor having a first terminal and a second terminal, the first terminal of the resistor coupled to the output of the amplifier. The apparatus also includes a second transconductance amplifier having a first input, a second input, a first output, and a second output, the first input of the second transconductance amplifier coupled to the second terminal of the resistor, the second input of the second transconductance amplifier coupled to the output of the amplifier and the first terminal of the resistor, the first output of the second transconductance amplifier coupled to the first terminal of the first switch, the second output of the second transconductance amplifier coupled to the first terminal of the second switch. The apparatus also includes a third transconductance amplifier having a first input, a second input, a first output, and a second output, the first input of the third transconductance amplifier coupled to the second terminal of the resistor and the first input of the second transconductance amplifier, the second input of the third transconductance amplifier coupled to the first terminal of the fifth switch, the first output of the third transconductance amplifier coupled to first terminal of the fourth switch, the second output of the third transconductance amplifier coupled to the first terminal of the third switch. Other examples are described.

BRIEF DESCRIPTION OF THE DRAWINGS

The same reference numbers or other reference designators are used in the drawings to designate the same or similar (functionally or structurally) features.

DETAILED DESCRIPTION

Figure 1:
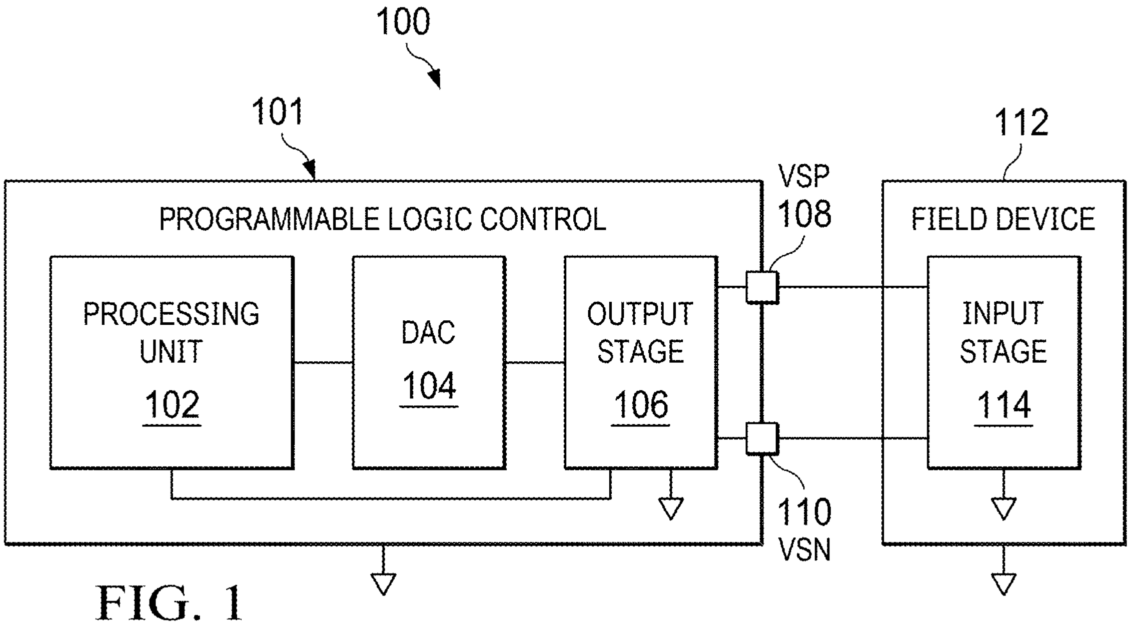
FIG. 1 is an example system including programmable logic control to transmit control signals to a field device in conjunction with examples described herein.

The drawings are not necessarily to scale. Generally, the same reference numbers in the drawing(s) and this description refer to the same or like parts. Although the drawings show regions with clean lines and boundaries, some or all of these lines or boundaries may be idealized. In reality, the boundaries or lines may be unobservable, blended or irregular.

Electrical systems, such as industrial automation systems, irrigation systems, automotive systems, building automation systems, etc., utilize digital-to-analog converters (DAC) to convert digital control signals from a processor or controller to analog voltage or current signals that are transmitted to a device to control the device. For example, a controller may provide a control signal to device, such as a temperature sensor, a valve, an actuator, another computing device, etc. The device performs one or more actions or operations based on the control signal. The DAC may include or be coupled to an output stage to convert the analog signal to a higher power analog voltage or current.

The output stage utilizes one or more feedback loops and a force amplifier to impress a DAC signal to an output terminal. The feedback loop(s) provide close loop feedback for the force amplifier to impress the DAC signal to the output terminal. The output stage may be a current output stage, a voltage output stage, or a current/voltage output stage. A current output stage is an output stage that provides an analog current signal to a device based on the analog DAC output signal. A voltage output stage is an output stage that provides an analog voltage to a device based on the analog DAC output signal, and a current/voltage output stage is an output stage that is structured to output an analog current signal or an analog voltage signal to a device based on the analog DAC output signal.

Some output stages utilize instrumentation amplifiers (INAs), such as voltage feedback amplifiers, in the feedback loops. Such INAs output a voltage based on a voltage differential between the inputs. For a current output stage, the inputs correspond to the current provided by the output stage. For a voltage output stage, the inputs correspond to an output of the voltage output stage and a negative voltage source (VSN) terminal that is connected to a ground terminal of the field device. Voltage feedback INAs are used because they have limited noise and provide linearity. However, INAs use resistors to translate a common mode signal that is present at the input terminals to a signal that allows a force amplifier to operate. As used herein common mode refers to a difference between the local ground of a device and the actual factory or earth ground. For example, the output stage of the DAC is referenced to a first local ground and the input stage of the field device is referenced to a second local ground. The first local ground and the second local ground may be different than the factory or earth ground. Accordingly, the common mode voltage of the transmitting device that utilizes the DAC may be different than the common mode voltage of the receiving device (e.g., the field device).

The INAs utilize a local ground to provide the feedback. However, the INAs output is based on the common mode difference between the transmitting and receiving device. Also, the transmitting device does not know the local ground of the receiving device. Because of the common mode difference between the transmitting device and the receiving device, the resistors implemented in the INAs start to play a role in calling out the common mode resistance, resulting in a common mode rejection ratio (CMRR). The CMRR indicates an ability to suppress signals common to the two inputs of the INA. The higher the CMRR, the better the INA is at suppressing the common signals. Ideally, an amplifier senses a difference between two signals, without being affected by the common mode of the receiver. However, because the INA obtains signals that reference a local ground of a receiver and include at least one resistor that is coupled to a local ground of the transmitter, the INA is sending a difference between two signals while being affected by the common mode of the receiver.

As described above, the resistors of the INA play a role in increasing the CMRR. However, the amount of CMRR is limited by the characteristics of the resistors. For example, the more the resistors vary in resistance from one another, the lower the CMRR is for the INA. To generate accurate results, the resistors of the INA need to be the same, which may be difficult or impossible to implement without large expensive resistors. Accordingly, the accuracy of the system is limited to any sensitivity to the common-mode difference. For example, a system may be limited to 0.1% full-scale accuracy using DACs with accuracies as high as 0.002% full-scale. To increase CMRR beyond 80 decibels (dB), thereby increasing the accuracy of the system, such INA feedback-based output stages require very large resistor or expensive, complicated, and large trimming procedures.

Examples described herein include an output stage that utilizes current feedback amplifiers, such as transconductance amplifiers, to increase CMRR to above 120 dB without trim or large resistors. The described current feedback amplifiers have better common-mode mode rejection because the described current feedback amplifiers to not reference a local ground, thereby mitigating sensitivity to the common mode difference between the transmitting device and the receiving device. Although some current amplifiers suffer from poorer linearity and higher noise than voltage amplifiers, the described current amplifiers include circuitry for voltage amplification, which improves noise and linearity. Accordingly, examples described herein result in an output stage has a CMRR above 120 dB without requiring trim or large resistors. Also, examples described herein allow for higher loop bandwidth and slew rates, and current output impedance of over 450 Megaohms without utilizing trim. Accordingly, examples described herein result in a DAC output stage with lower cost, lower area, high performance across temperature and lifetime, operating at a high speed.

FIG. 1 illustrates an example electrical system 100. The electrical system 100 of FIG. 1 includes an example programmable logic control 101, which includes an example processing unit 102, an example DAC 104, an example output stage 106, a positive voltage supply (VSP) terminal 108, and a negative voltage supply (VSN) terminal 110. The electrical system 100 further includes an example field device 112 including an input stage 114. Also, one or more of the components of the programmable logic control 101 or field device 112 may be removed or combined. Also, additional components may be added to the programmable logic control 101 or field device 112.

The programmable logic control 101 of FIG. 1 may be a central processing device that controls one or more field devices, including the field device 112. For example, the programmable logic control 101 may provide an analog voltage or current to the field device 112 and the field device 112 performs an action or operation based on the analog voltage or current.

The processing unit 102 of FIG. 1 generates a digital signal that is converted to an analog signal to control the field device 112. The processing unit 102 includes two outputs (also referred to as output terminals). The first output of the processing unit 102 is coupled to the DAC 104. The second output of the processing unit 102 is coupled to the output stage 106. The processing unit 102 generates one or more control signals to control the field device 112. The one or more control signals are digital control signals that correspond to one or more digital values that correspond to an action or operation. The processing unit 102 provides the digital control signal to the DAC 104. Also, based on the characteristics of the field device 112, the processing unit 102 may provide an offset value to the output stage 106. For example, the DAC 104 may be structured to output an analog signal between 0 Volts (V) and 10 V and the receiver operates between −5 V and 5 V, the processing unit 102 can provide an offset value to ensure that the output stage 106 provides a signal between −5 V and 5 V to the receiver, even though the DAC operates between 0 and 10 V. The processing unit 102 may be a processor, a controller, a graphics processing unit, a central processing unit, or any other processing unit.

The DAC 104 of FIG. 1 converts a digital signal from the processing unit 102 to an analog signal. The DAC 104 includes an input (also referred to as an input terminal) and an output. The input of the DAC 104 is coupled to the processing unit 102 and the output of the DAC 104 is coupled to the output stage 106.

The output stage 106 of FIG. 1 may be a force-sense system, a kelvin connected system, or another system that converts the output signal from the DAC 104 into an output voltage or current that is provided to the field device 112 via the VSP terminal 108. A force-sense connected system or a kelvin connected system is an electrical circuit where separate force and sense wires are used to connect a load, allowing for accurate measurement of voltage or current by minimizing impact of voltage drops in the power delivery wires. The output stage 106 includes a first input, a second input, a first output, a second output, and a local ground terminal (e.g., common terminal). The first input of the output stage 106 is coupled to the DAC 104. The second input of the output stage 106 is coupled to the processing unit 102, the first output is coupled to the terminal 108, the second output is coupled to the terminal 110. The output stage 106 includes a force amplifier and two or more transconductance amplifiers to convert the output of the DAC 104 from an analog signal to an analog current or voltage. The output stage provides the generated current or voltage to the field device 112. The output stage 106 is further described below in conjunction with FIGS. 2-5.

The VSP terminal 108 and the VSN terminal 110 are screw terminals. The output of the force amplifier (e.g., the force-positive output) in the output stage 106 is provided to the field device 112 via the VSP terminal 108 and the VSN terminal 110 is a force-negative output that establishes the current return paths to complete the circuit at a local ground of the output stage 106.

The field device 112 of FIG. 1 is a device that is controlled based on the output current or voltage from the programmable logic control 101. The field device may be a sensor, an actuator, a valve, a computing device, etc. The field device 112 includes an input stage 114 to receive the current or voltage provided by the output stage 106. In some examples, the field device 112 may include additional components, such as an analog-to-digital converter to convert the received analog current or voltage to a digital signal that can be processed or used by another component of the field device 112 to field device 112. The input stage 114 includes a first input, a second input, and a local ground (e.g., common terminal). As described above, the local ground voltage of the input stage may be different than the local ground voltage at the output stage 106 corresponding to common mode mismatch. The first input of the input stage 114 is coupled to the terminal 108 of the programmable logic control 101. The second input of the input stage 114 is coupled to the terminal 110.

Figure 2:
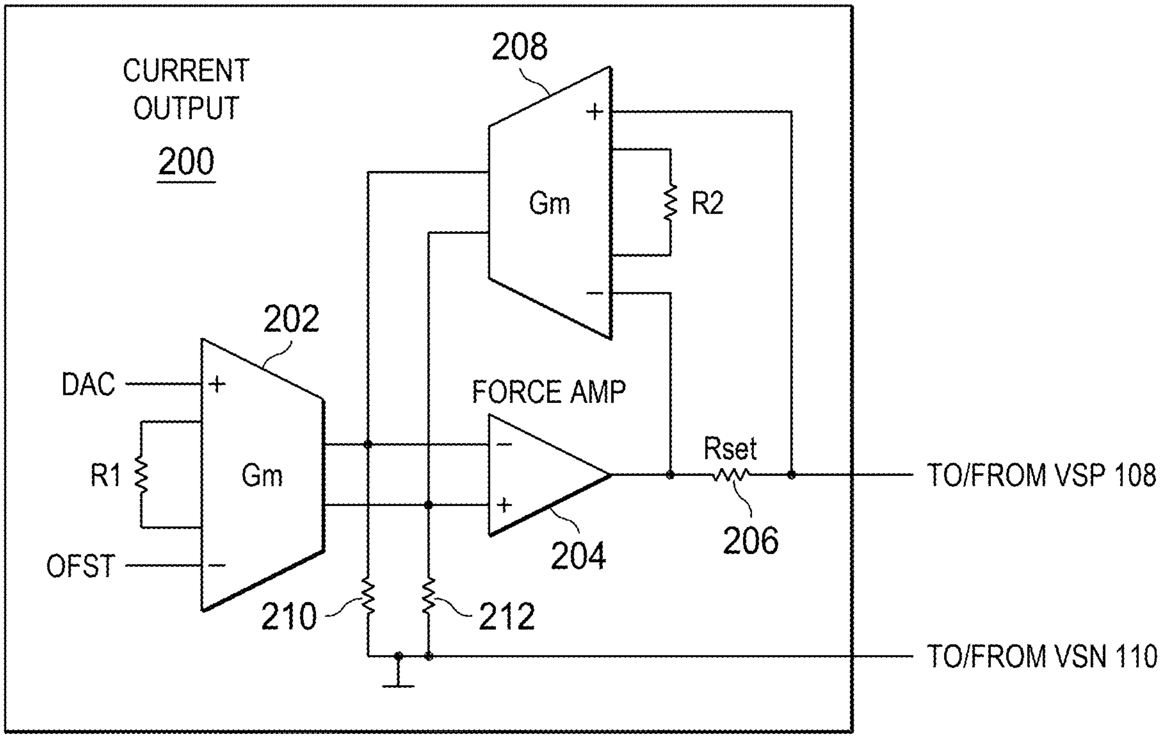
FIG. 2 is a circuit diagram of an example implementation of the output stage of FIG. 1.

FIG. 2 is an example current output stage 200 that can be used to implement the output stage 106 of FIG. 1. The current output stage 200 converts the analog output of the DAC 104 into an analog current that is provided to the field device 112 via the VSP terminal 108. The current output stage 200 includes example transconductance amplifiers 202, 208, an example force amplifier 204, and example resistors 206, 210, 212.

The transconductance amplifier 202 of FIG. 2 amplifies a difference between the voltage provided by the DAC 104 and the offset voltage provided by the processing unit 102. The transconductance amplifier 202 includes a first input, a second input, a first output, and a second output. The first input, the non-inverting input, of the transconductance amplifier 202 is coupled to the output of the DAC 104. The second input, the inverting input, of the transconductance amplifier 202 is coupled to an output of the processing unit 102. The first output of the transconductance amplifier 202 is coupled to the first output of the transconductance amplifier 208, the first input of the force amplifier 204, and the first terminal of the resistor 210. The second output of the transconductance amplifier 202 is coupled to the second output of the transconductance amplifier 208, the second input of the force amplifier 204, and the first terminal of the resistor 212. The transconductance amplifier 202 senses a voltage difference between the output voltage of the DAC 104 and the offset voltage of the processing unit 102. The transconductance amplifier 202 provides currents based on the voltage difference to offset the output voltage of the DAC 104 based on the offset. In this manner, the output current of the output stage 200 corresponds to the current requirements of the field device 112. The illustrated resistor R1 is a component (e.g., the resistor 614 of FIG. 6) of the transconductance amplifier 202 that provides voltage amplification to improve noise and linearity. The transconductance amplifier 202 is further described below in conjunction with FIG. 6.

The force amplifier 204 of FIG. 2 amplifies the difference between voltages at the two inputs to force the voltages at the two inputs to be equal by adjusting the output voltage so that the transconductance amplifier 208 adjusts the output currents to ensure that the input voltages of the force amplifier 204 are equal. The force amplifier 204 includes a first input, a second input, and an output. The first input, an inverting input, of the force amplifier 204 is coupled to the first output of the transconductance amplifier 202, the first output of the transconductance amplifier 208, and the first terminal of the resistor 210. The second input, the non-inverting input, of the force amplifier 204 is coupled to the second output of the transconductance amplifier 202, the second output of the transconductance amplifier 208, and the first terminal of the resistor 212. The output of the force amplifier 204 is coupled to the second input of the transconductance amplifier 208 and the first terminal of the resistor 206. As described above, the force amplifier 204 forces the voltages at the first input and the second input of the force amplifier 204 to be equal. The voltage at the first input of the force amplifier 204 corresponds to a sum of the current provided by the first output of the transconductance amplifier 202 and the current provided by the first output the transconductance amplifier 208. The sum of the two currents flow across the resistor 210 to a common terminal, thereby generating a voltage at the first terminal of the force amplifier 204. The voltage at the second input of the force amplifier 204 corresponds to a sum of the current provided by the second output of the transconductance amplifier 202 and the current provided by the second output the transconductance amplifier 208. The sum of the two currents flow across the resistor 212 to a common terminal, thereby generating a voltage at the second terminal of the force amplifier 204. The voltage provided by the force amplifier 204 is applied to the resistor 206, thereby generating an output current corresponding to the DAC output voltage and the OFFSET signal, as shown in the below Equation 1.

$$I_{out} = (DAC - \text{OFFSET})\frac{R2}{R1 * Rset} \quad \text{(Equation 1)}$$

In the above-Equation 1, Iout is the output current of the output stage 106 provided to the VSP terminal 108, DAC is the voltage provided by the DAC 104, OFFSET is the offset voltage provided by the processing unit 102, R2 is the resistance of the resistor included in the transconductance amplifier 208, R1 is the resistance of the resistor included in the transconductance amplifier 202, and Rset is the resistance of the resistor 206. In the example of FIG. 2, the force amplifier 204 is a voltage amplifier. However, the force amplifier 204 may be a current amplifier. In such examples, the resistors 210, 212 would be removed from the output stage 200.

The resistor 206 of FIG. 2 is a current setting resistor. The resistor 206 includes a first terminal and a second terminal. The first terminal of the resistor 206 is coupled to the output of the force amplifier 204 and the second input of the transconductance amplifier 208. The second terminal of the resistor 206 is coupled to the first input of the transconductance amplifier 208 and the VSP terminal 108. In some examples, the resistor 206 is a variable resistor to support different current ranges. In such examples, the resistor 206 may include a plurality of switched resistors that can be coupled or decoupled together based on control signal(s) from the processing unit 102 to change the total resistor of the variable resistor 206.

The transconductance amplifier 208 of FIG. 2 amplifies the voltage across the resistor 206, which corresponds to the output voltage of the force amplifier 204 and the output current of the output stage 200. The transconductance amplifier 208 includes a first input, a second input, a first output, and a second output. The first input, the non-inverting input, of the transconductance amplifier 208 is coupled to the second terminal of the resistor 206 and the VSP terminal 108. The second input, the inverting input, of the transconductance amplifier 208 is coupled to the output of the force amplifier 204 and the first terminal of the resistor 206. The first output of the transconductance amplifier 208 is coupled to the first output of the transconductance amplifier 202, the first input of the force amplifier 204, and the first terminal of the resistor 210. The second output of the transconductance amplifier 208 is coupled to the second output of the transconductance amplifier 202, the second input of the force amplifier 204, and the first terminal of the resistor 212. The transconductance amplifier 208 senses a voltage difference across the resistor 206 that is line with the high gain force amplifier 204. The transconductance amplifier 208 amplifies the difference to generate output currents used as feedback for the force amplifier 204. The illustrated resistor R2 is a component (e.g., the resistor 614 of FIG. 6) of the transconductance amplifier 208 that provides voltage amplification to improve noise and linearity. The transconductance amplifier 208 is further described below in conjunction with FIG. 6.

The resistors 210, 212 of FIG. 2 provide a path for the output currents of the transconductance amplifiers 202, 208 to flow toward the common terminal and generate a voltage at the input terminals of the force amplifier 204. The resistors 210, 212 each include a first terminal and a second terminal. The first terminal of the resistor 210 is coupled to the first outputs of the transconductance amplifiers 202, 208 and the first input of the force amplifier 204. The second terminal of the resistor 210 is coupled to a common terminal (e.g., local ground) and the VSN terminal 110. The first terminal of the resistor 212 is coupled to the second outputs of the transconductance amplifiers 202, 208 and the second input of the force amplifier 204. The second terminal of the resistor 212 is coupled to a common terminal (e.g., local ground) and the VSN terminal 110.

Figure 3:
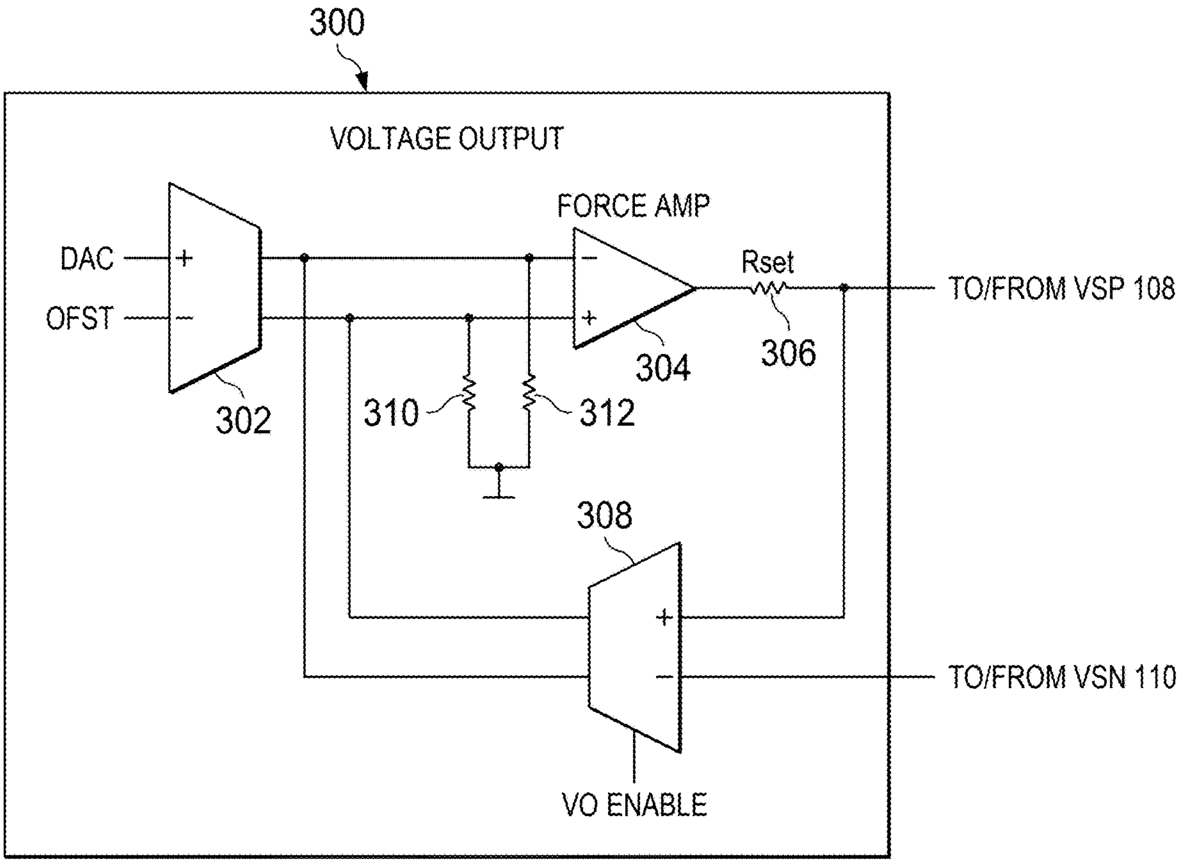
FIG. 3 is a circuit diagram of an alternative example implementation of the output stage of FIG. 1.

FIG. 3 is an example voltage output stage 300 that can be used to implement the output stage 106 of FIG. 1. The voltage output stage 300 converts the analog output of the DAC 104 into an analog voltage that is provided to the field device 112 via the VSP terminal 108. The voltage output stage 300 includes example transconductance amplifiers 302, 308, an example force amplifier 304, and example resistors 306, 310, 312.

The transconductance amplifier 302, the force amplifier 304, and the resistors 306, 310, 312 of FIG. 3 operate in the same manner as the transconductance amplifier 202, the force amplifier 204, and the resistors 206, 210, 212 of FIG. 2. The transconductance amplifier 308 of FIG. 3 differs from the transconductance amplifier 208 of FIG. 2 by sensing a difference between the voltage at the VSP terminal 108 and the VSN terminal 110. Thus, the feedback is based on output voltage instead of output current. Accordingly, the output stage 300 outputs a voltage that corresponds to the analog signal output by the DAC 104.

The transconductance amplifier 308 of FIG. 3 amplifies the voltage differential between the voltage at the VSP terminal 108 and the voltage at the VSN terminal 110, which corresponds to the output voltage of the output stage 300. The transconductance amplifier 308 includes a first input, a second input, a first output, and a second output. The first input, the non-inverting input, of the transconductance amplifier 302 is coupled to the second terminal of the resistor 306 and the VSP terminal 108. The second input, the inverting input, of the transconductance amplifier 308 is coupled to the VSN terminal 110. The first output of the transconductance amplifier 308 is coupled to the first output to the second output of the transconductance amplifier 302, the second input of the force amplifier 304, and the first terminal of the resistor 312. The second output of the transconductance amplifier 308 is coupled to the first output of the transconductance amplifier 302, the first input of the force amplifier 304, and the first terminal of the resistor 310. The transconductance amplifier 308 senses a voltage difference across the VSP terminal 108 and the VSN terminal 110 that is in line with the high gain force amplifier 304. The transconductance amplifier 308 amplifies the difference to generate output currents used as feedback for the force amplifier 304. The transconductance amplifier 308 is further described below in conjunction with FIG. 6.

Figure 4:
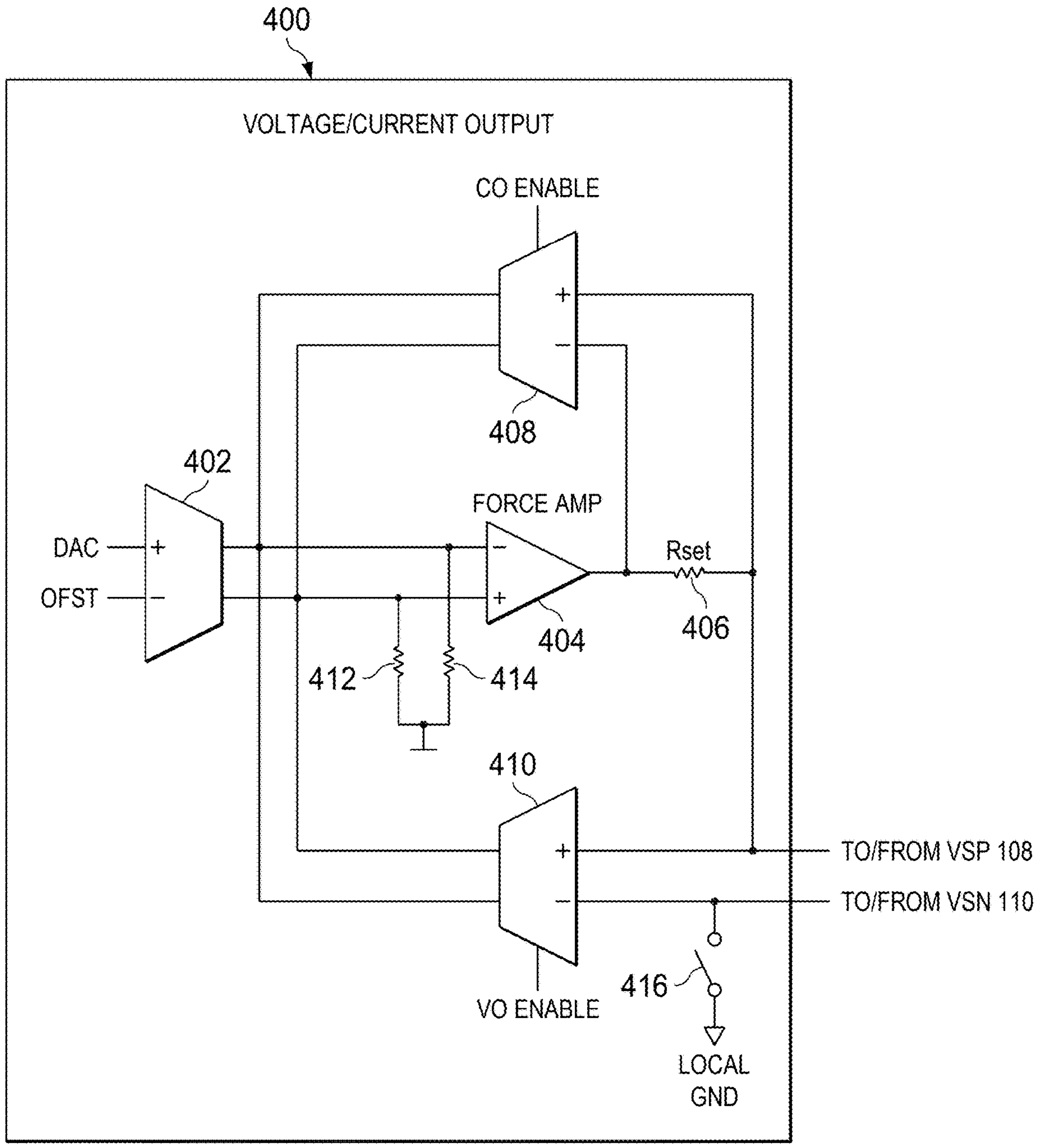
FIG. 4 is a circuit diagram of an alternative example implementation of the output stage of FIG. 1.

FIG. 4 is an example current/voltage output stage 400 that can be used to implement the output stage 106 of FIG. 1. The current/voltage output stage 400 converts the analog output of the DAC 104 into an analog voltage or an analog current that is provided to the field device 112 via the VSP terminal 108. The current/voltage output stage 400 includes example transconductance amplifiers 402, 408, 410, an example force amplifier 404, and example resistors 406, 412, 414, and an example switch 416.

The transconductance amplifier 402, the force amplifier 404, and the resistors 406, 412, 414 of FIG. 4 operate in the same manner as the transconductance amplifier(s) 202, 302, the force amplifier(s) 204, 304, and the resistors 206, 210, 212, 306, 310, 312 of FIG. 2 or 3. Also, the transconductance amplifier 408 operates in the same manner as the transconductance amplifier 208 of FIG. 2 and the transconductance amplifier 410 operates in the same manner as the transconductance amplifier 308 of FIG. 3. The output stage 400 combines the current output stage 200 of FIG. 2 with the voltage output stage 300 of FIG. 3. Thus, the current/voltage output stage 400 can operate as a current output stage or a voltage output stage. The transconductance amplifiers 408, 410 include enable terminals to enable one of the transconductance amplifiers 408, 410 and disable the other. The enable terminals of the transconductance amplifiers 408, 410 may be coupled to the processing unit 102. In this manner, the processing unit 102 can control whether the current/voltage output stage 400 operates as a current output stage or a voltage output stage.

The first output of the transconductance amplifier 408 of FIG. 4 is coupled to the first output of the transconductance amplifier 402, the first output of the transconductance amplifier 410, the first input of the force amplifier 404, and the first terminal of the resistor 414. The second output of the transconductance amplifier 408 is coupled to the second output of the transconductance amplifier 402, the second output of the transconductance amplifier 410, the second input of the force amplifier 404, and the first terminal of the resistor 412. The first output of the transconductance amplifier 410 is coupled to the second output of the transconductance amplifier 402, the first output of the transconductance amplifier 408, the second input of the force amplifier 404, and the first terminal of the resistor 412. The second output of the transconductance amplifier 410 is coupled to the first output of the transconductance amplifier 402, the second output of the transconductance amplifier 408, the first input of the force amplifier 404 and the first terminal of the resistor 414.

The current/voltage output stage 400 of FIG. 4 includes a switch 416. The switch 416 has a first terminal and a second terminal. The first terminal of the switch 416 is coupled to the second input of the transconductance amplifier 410 and the VSN terminal 110. The second terminal of the switch 416 is coupled to a common terminal (e.g., a local ground). The switch 416 may be a transistor or other type of switch that can open or close. The switch 416, if open, creates an open circuit. The switch 416, if closed, creates a closed circuit to short the second input of the transconductance amplifier 410 to ground. The processing unit 102 may control the switch 416 (e.g., to open or close). For example, if the current/voltage output stage 400 is structured to operate as a current output stage, the processing unit 102 may close the switch 416. Also, if the current/voltage output stage 400 is structured to operate as a voltage output stage, the processing unit 102 may open the switch 416 to sense the local ground of the field device 112. This allows forcing accurate voltage across field device loads irrespective of the local ground of the field device 112.

Figure 5:
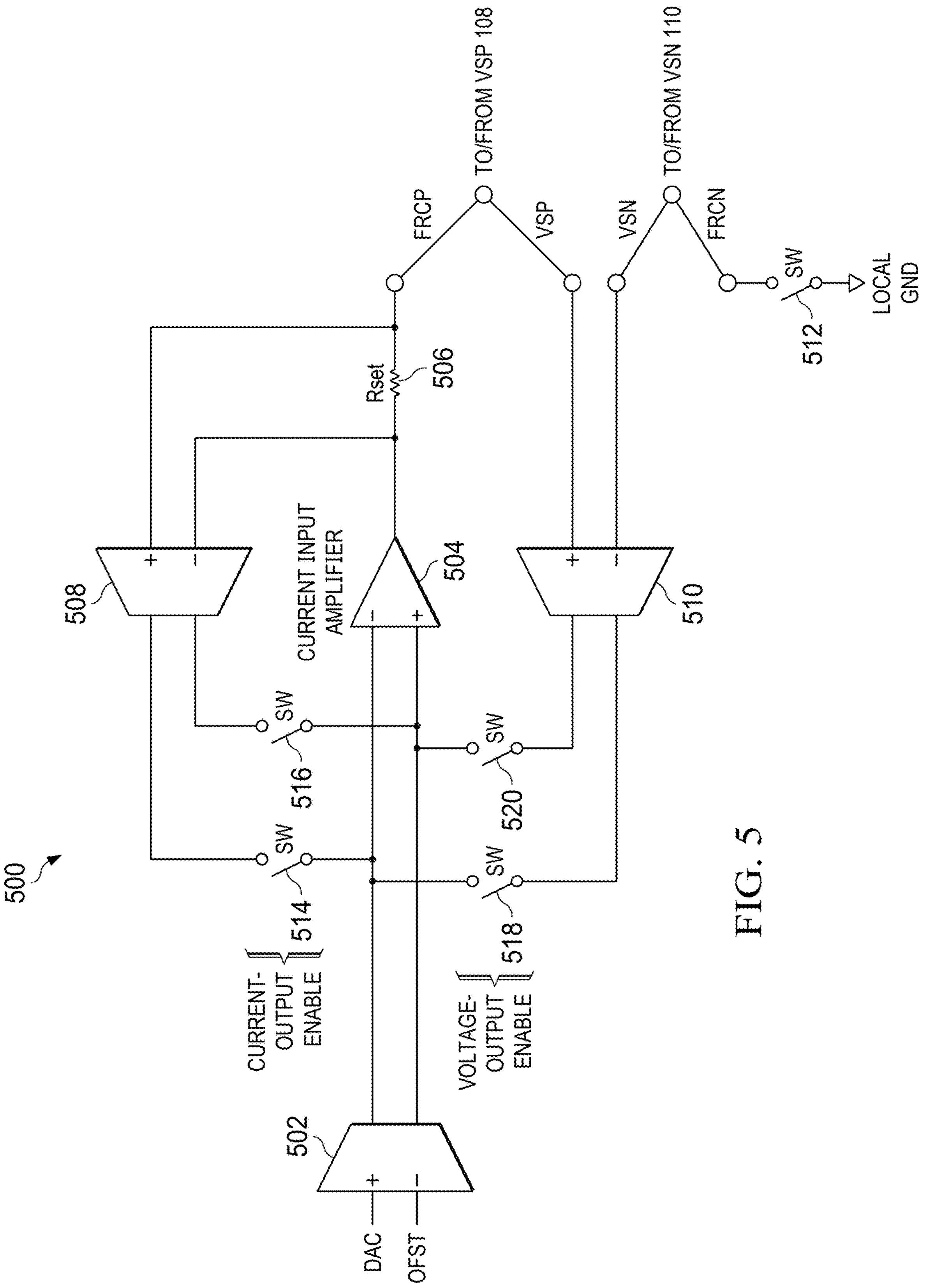
FIG. 5 is a circuit diagram of an example implementation of the output stage of FIG. 1.

FIG. 5 is an alternative example current/voltage output stage 500 that can be used to implement the output stage 106 of FIG. 1. The current/voltage output stage 500 converts the analog output of the DAC 104 into an analog voltage or an analog current that is provided to the field device 112 via the VSP terminal 108. The current/voltage output stage 500 includes example transconductance amplifiers 502, 508, 510, an example force amplifier 504, an example resistor 506, and example switches 512, 514, 516, 518, 520.

The amplifier 504 of FIG. 5 is a current input force amplifier. The amplifier 504 includes a first input, a second input, and an output. The first input of the amplifier 504 is an inverting input that is coupled to the first output of the transconductance amplifier 502, the second terminal of the switch 516, and the second terminal of the switch 518. The second input of the amplifier 504 is a non-inverting input that is coupled to the second output of the transconductance amplifier 502, the second terminal of the switch 514, and the second terminal of the switch 520. The current input amplifier 504 forces the currents at the inputs to be equal by outputting a voltage, causing the transconductance amplifiers 508, 510 to adjust the currents at the inputs of the current input amplifier 504 to be equal. Because the voltage input force amplifier 404 of FIG. 5 is replaced with the current input amplifier 504, the resistors 412, 414 are not included, as they can be implemented within the current input amplifier 504.

The resistor 506 and the switch 512 of FIG. 5 operate in the same manner as the resistor 406 and the switch 416 of FIG. 4. The transconductance amplifiers 502, 508, 510 operate in the same manner as the transconductance amplifiers 402, 408, 410 of FIG. 4. However, the transconductance amplifiers 508, 510 do not include an enable terminal to enable or disable operation of the transconductance amplifiers 508, 510. Instead, the processing unit 102 can enable the output stage 500 to operate as a current output stage or a voltage output stage by controlling the switches 514, 516, 518, 520. For example, the processing unit 102 can enable the output stage 500 to operate as a current output stage by outputting one or more control signals to close the switches 514, 516 and open the switches 518, 520. Also, the processing unit can enable the output stage 500 to operate as a voltage output stage by outputting one or more control signals to open the switches 514, 516 and close the switches 518, 520. However, if the transconductance amplifiers 508, 510 include the enable terminals of FIG. 4, the switches 514, 516, 518, 520 can be removed in place of a short circuit (e.g., a wire, etch, etc.).

The switches 514, 516, 518, 520 of FIG. 5 each include a first terminal and a second terminal. The first terminal of the switch 514 is coupled to the first output of the transconductance amplifier 508. The second terminal of the switch 514 is coupled to the first output of the transconductance amplifier 502, the first input of the current input force amplifier 504, and the second terminal of the switch 518. The first terminal of the switch 516 is coupled to the second output of the transconductance amplifier 508. The second terminal of the switch 516 is coupled to the second output of the transconductance amplifier 502, the second input of the current input force amplifier 504, and the second terminal of the switch 520. The first terminal of the switch 518 is coupled to the second output of the transconductance amplifier 510. The second terminal of the switch 520 is coupled to the first output of the transconductance amplifier 502, the second terminal of the switch 516, and the first input of the current force amplifier 504. The first terminal of the switch 520 is coupled to the first output of the transconductance amplifier 510. The second terminal of the switch 520 is coupled to the second output of the transconductance amplifier 502, the second terminal of the switch 514, and the second input of the force amplifier 504. The switches 514, 516, 518, 520 may be implemented by one or more transistors, multiplexers, or other circuitry.

Figure 6:
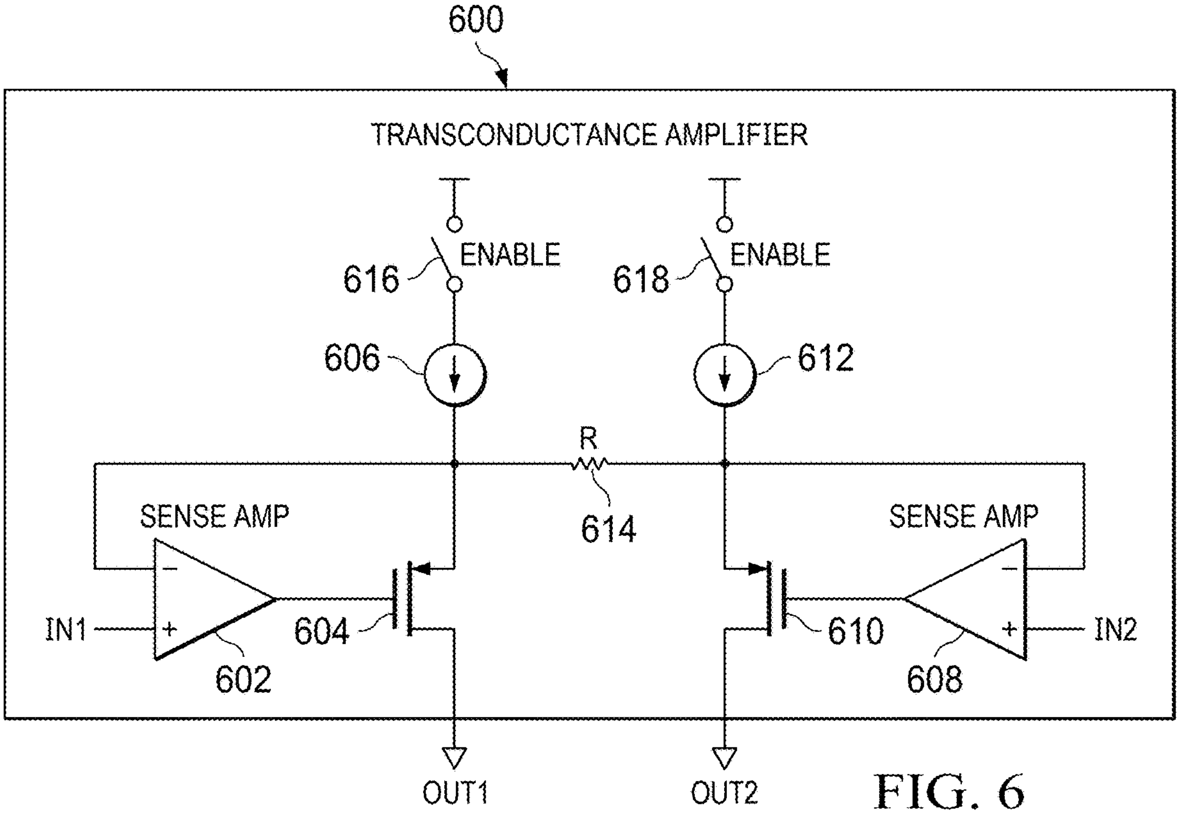
FIG. 6 is a circuit diagram of an alternative example implementation of the transconductance amplifiers of FIGS. 2-5.

FIG. 6 is an example transconductance amplifier 600 that can be used to implement the transconductance amplifiers 202, 208, 302, 308, 402, 408, 410, 502, 508, 510 of FIGS. 2-5. The transconductance amplifier 600 includes example sense amplifiers 602, 608, example transistors 604, 610, example current sources 606, 612, an example resistor 614, and example switches 616, 618.

The sense amplifier 602 of FIG. 6 is an amplifier that generates an output voltage that is an amplification of a difference in voltage between the two inputs of the amplifier 602. The sense amplifier 602 includes a first input (e.g., an inverting input), a second input (e.g., a non-inverting input), and an output. The first input of the sense amplifier is coupled to the first current terminal of the transistor 604, the second terminal of the current source 606, and the first terminal of the resistor 614. The second input of the sense amplifier 602 is coupled to the first input of the transconductance amplifier 600. Accordingly, if the transconductance amplifier 600 implements the transconductance amplifiers 202, 302, 402, 502, the second input of the sense amplifier 602 is coupled to the DAC 104. If the transconductance amplifier 600 implements the transconductance amplifiers 208, 308, 408, 410, 508, 510, the second input of the sense amplifier 602 is coupled to the second terminal of the resistors 206, 306, 406, 506 and the VSP terminal 108. The output of the sense amplifier 602 is coupled to the control terminal of the transistor 604. The amplifier 602 outputs a voltage that is an amplified difference between the two input voltages. The amplifier 602 outputs a voltage to force the voltage at the two inputs to be equal, as further described below.

The transistor 604 of FIG. 6 is controlled based on the output of the sense amplifier 602. The transistor includes a first current terminal (e.g., a source terminal), a second current terminal (e.g., a drain terminal), and a control terminal (e.g., a gate terminal). The first current terminal of the transistor 604 is coupled to the first input of the sense amplifier 602, the second terminal of the current source 606, and the first terminal of the resistor 614. The second current terminal of the transistor 604 is coupled to the first output of the transconductance amplifier 600. Accordingly, if implementing the transconductance amplifier 202, 302, 402, 502, the first current terminal of the transistor 604 is coupled to one or more of the force amplifier(s) 204, 304, 404, 504, the transconductance amplifier(s) 208, 308, 408, 410, 508, 510, or the resistors 412, 414. If implementing the transconductance amplifier 208, 308, 408, 410, 508, 510, the first current terminal of the transistor 604 is coupled to one or more of the force amplifier(s) 204, 304, 404, 504, the transconductance amplifier(s) 202, 208, 302, 308, 402, 408, 410, 502, 508, 510, or the resistors 412, 414. The control terminal of the transistor 604 is coupled to the output of the sense amplifier 602. The transistor 604 is a p-channel metal oxide semiconductor field effect transistor (PMOS, P-channel MOSFET, etc.). However, the transistor 604 may be implemented by another type of transistor. If the voltage provided by the sense amplifier 602 is above a threshold, the transistor 604 blocks current from flowing to the first output. If the voltage provided by the sense amplifier 602 is below the threshold, the transistor 604 allows at least some current to flow out through the first output. The amount of current that the transistor 604 allows may be based on the amount of voltage provided by the sense amplifier 602.

The current source 606 of FIG. 6 provides a current (e.g., a predefined or preset amount of current) toward the node corresponding to the first input of the sense amplifier 602, the first terminal of the resistor 614 and the first current terminal of the transistor 604. The current source has an input and an output. The input of the current source 606 is coupled to the second terminal of the switch 616. The output of the current source 606 is coupled to the first input of the sense amplifier 602, the first terminal of the resistor 614 and the first current terminal of the transistor 604. If the switch 616 is closed, the current source 606 utilizes the supply terminal to provide current at the output terminal. The amount of current that the current source 606 provides is the same, or substantially similar to, the current provided by the current source 612.

The sense amplifier 608 of FIG. 6 is an amplifier that generates an output voltage that is an amplification of a difference in voltage between the two inputs of the amplifier 608. The sense amplifier 608 includes a first input (e.g., an inverting input), a second input (a non-inverting input), and an output. The first input of the sense amplifier is an inverting input that is coupled to the first current terminal of the transistor 610, the second terminal of the current source 612 and the second terminal of the resistor 614. The second input of the sense amplifier 608 is coupled to the second input of the transconductance amplifier 600. Accordingly, if the transconductance amplifier 600 implements the transconductance amplifiers 202, 302, 402, 502, the second input of the sense amplifier 608 is coupled to the processing unit 102 to obtain the offset signal. If the transconductance amplifier 600 implements the transconductance amplifiers 208, 408, 508, the second input of the sense amplifier 608 is coupled to the first terminal of the resistors 206, 306, 406, 506. If the transconductance amplifier 600 implements the transconductance amplifiers 308, 410, 510, the second input of the sense amplifier 608 is coupled to one or more of the VSN terminal 110 or the switch 416. The output of the sense amplifier 608 is coupled to the control terminal of the transistor 610. The amplifier 608 outputs a voltage that is an amplified difference between the two input voltages. The amplifier 608 outputs a voltage to force the voltage at the two inputs to be equal, as further described below.

The transistor 610 of FIG. 6 is controlled based on the output of the sense amplifier 608. The transistor includes a first current terminal (e.g., a source terminal), a second current terminal (e.g., a drain terminal), and a control terminal (e.g., a gate terminal). The first current terminal of the transistor 610 is coupled to the first input of the sense amplifier 608, the second terminal of the current source 612, and the second terminal of the resistor 614. The second current terminal of the transistor 610 is coupled to the second output of the transconductance amplifier 600. Accordingly, if implementing the transconductance amplifier 202, 302, 402, 502, the first current terminal of the transistor 610 is coupled to one or more of the force amplifier(s) 204, 304, 404, 504, the transconductance amplifier(s) 208, 308, 408, 410, 508, 510, or the resistors 412, 414. If implementing the transconductance amplifier 208, 308, 408, 410, 508, 510, the first current terminal of the transistor 610 is coupled to one or more of the force amplifier(s) 204, 304, 404, 504, the transconductance amplifier(s) 202, 208, 302, 308, 402, 408, 410, 502, 508, 510, or the resistors 412, 414. The control terminal of the transistor 610 is coupled to the output of the sense amplifier 608. The transistor 610 is a p-channel metal oxide semiconductor field effect transistor (PMOS, P-channel MOSFET, etc.). However, the transistor 610 may be implemented by another type of transistor. If the voltage provided by the sense amplifier 608 is above a threshold, the transistor 610 blocks current from flowing to the second output. If the voltage provided by the sense amplifier 608 is below the threshold, the transistor 610 allows at least some current to flow out through the second output. The amount of current that the transistor 610 allows may be based on the amount of voltage provided by the sense amplifier 608.

The current source 612 of FIG. 6 provides a current (e.g., a predefined or preset amount of current) toward the node corresponding to the first input of the sense amplifier 608, the second terminal of the resistor 614 and the first current terminal of the transistor 610. The current source has an input and an output. The input of the current source 612 is coupled to the second terminal of the switch 616. The output of the current source 612 is coupled to the first input of the sense amplifier 608, the second terminal of the resistor 614 and the first current terminal of the transistor 610. If the switch 616 is closed, the current source 612 utilizes the supply terminal to provide current at the output terminal. The amount of current that the current source 612 provides is the same, or substantially similar to, the current provided by the current source 612.

The resistor 614 of FIG. 6 creates a resistance path from one side of the transconductance amplifier 600 to the other side of the transconductance amplifier 600. The resistor 614 includes a first terminal and a second terminal. The first terminal of the resistor 614 is coupled to the first input of the sense amplifier 602, the first current terminal of the transistor 604, and the output of the current source 606. The second terminal of the resistor is coupled to the first input of the sense amplifier 608, the first current terminal of the transistor 610, and the output of the current source 612. If the voltage at the first terminal of the resistor 614 is the same as the voltage at the second terminal of the resistor 614, there is no voltage differential across the resistor 614. Thus, no current flows between the terminals of the resistor 614. If the voltage at the first terminal of the resistor 614 is different than the voltage at the second terminal of the resistor 614, then some current flows across the terminals of the resistor 614 . . . . The amplifiers 602, 608 track the IN1 and IN2 voltages ensuring the voltage difference across the resistor 614 which results in high linearity, low noise, and high CMRR.

The switch 616 of FIG. 6 connects or disconnects the supply terminal to the input of the current source 606. The switch 616 includes a first terminal and a second terminal. The first terminal of the switch 616 is coupled to a supply terminal. The second terminal of the switch 616 is coupled to the input of the current source 606. The processing unit 102 can output a control signal to open or close the switch 616 to enable or disable the use of the transconductance amplifier 600. For example, for the output stages 400 of FIG. 4, the processing unit 102 can configure the output stage 400 to operate as a current output stage or a voltage output stage depending on which transconductance amplifier 408 or 410 is enabled. Thus, the processing unit 102 can enable the transconductance amplifier 600 using the switch 616. The switch 616 may be implemented by one or more of transistors, multiplexers, or any other circuitry.

The switch 618 of FIG. 6 connects or disconnects the supply terminal to the input of the current source 612. The switch 618 includes a first terminal and a second terminal. The first terminal of the switch 618 is coupled to a supply terminal. The second terminal of the switch 618 is coupled to the input of the current source 612. The processing unit 102 can output a control signal to open or close the switch 618 to enable or disable the use of the transconductance amplifier 600. For example, for the output stages 400 of FIG. 4, the processing unit 102 can configure the output stage 400 to operate as a current output stage or a voltage output stage depending on which transconductance amplifier 408 or 410 is enabled. Thus, the processing unit 102 can enable the transconductance amplifier 600 using the switch 618. The switch 618 may be implemented by one or more of transistors, multiplexers, or any other circuitry. In some examples, the switches 616, 618 could be implemented in at a different portion of the circuit of FIG. 6 or the circuits of FIGS. 2-5 to enable voltage output and disable current output, or vice versa. For example, FIG. 5 includes the switches 514, 516, 518, 520. Accordingly, the switches 616, 618 can be removed from the circuit 500 of FIG. 5. Alternatively, the switches 618, 618 could be implemented at the outputs (e.g., out1 and out2)/second current terminal of the transistors 604, 610 to prevent the open or short the outputs to the rest of the circuit.

In operation, a first voltage is applied to the first input of the transconductance amplifier 600 (e.g., the second input of the sense amplifier 602). Also, a second voltage is applied to the second input of the transconductance amplifier 600 (e.g., the second input of the sense amplifier 608). As described above, the amplifiers 602, 608 generate an output to force the inputs to have the same voltage. Accordingly, the sense amplifier 602 outputs a voltage to force the voltage at the first terminal of the resistor 614 to be the first voltage and the sense amplifier 608 outputs a voltage to force the voltage at the second terminal of the resistor 614 to be the second voltage. If the first voltage is equal to the second voltage, there is no voltage drop across the resistor 614. Thus, no current, or a very small amount of current, flows across the resistor 614. Also, no, or a very small amount of current, flows into the inputs of the sense amplifier 602, 608, because the amplifiers 602, 608 have high or infinite input impedance. Thus, all the current from the current source 606 is provided at the first output via the current terminals of the transistor 604 and all of the current from the current source 612 is provided at the second output via the current terminals of the transistor 610. Because the current sources 606, 612 output the same current, the output terminals output the same current if the voltages at the inputs are the same.

If the first voltage is above the second voltage, then there is a voltage differential across the first and second terminals of the resistor 614. Thus, at least some of the current from the current source 606 flows out from the second output via the current terminals of the transistor 610. Accordingly, the amount of current out from the first output terminal is less than the amount of current out from the second output terminal. If the first voltage is below the second voltage, then there is a voltage differential across the first and second terminals of the resistor 614. Thus, at least some of the current from the current source 612 flows out from the first output via the current terminals of the transistor 604. Accordingly, the amount of current out from the second output terminal is less than the amount of current out from the first output terminal.

Figure 7:
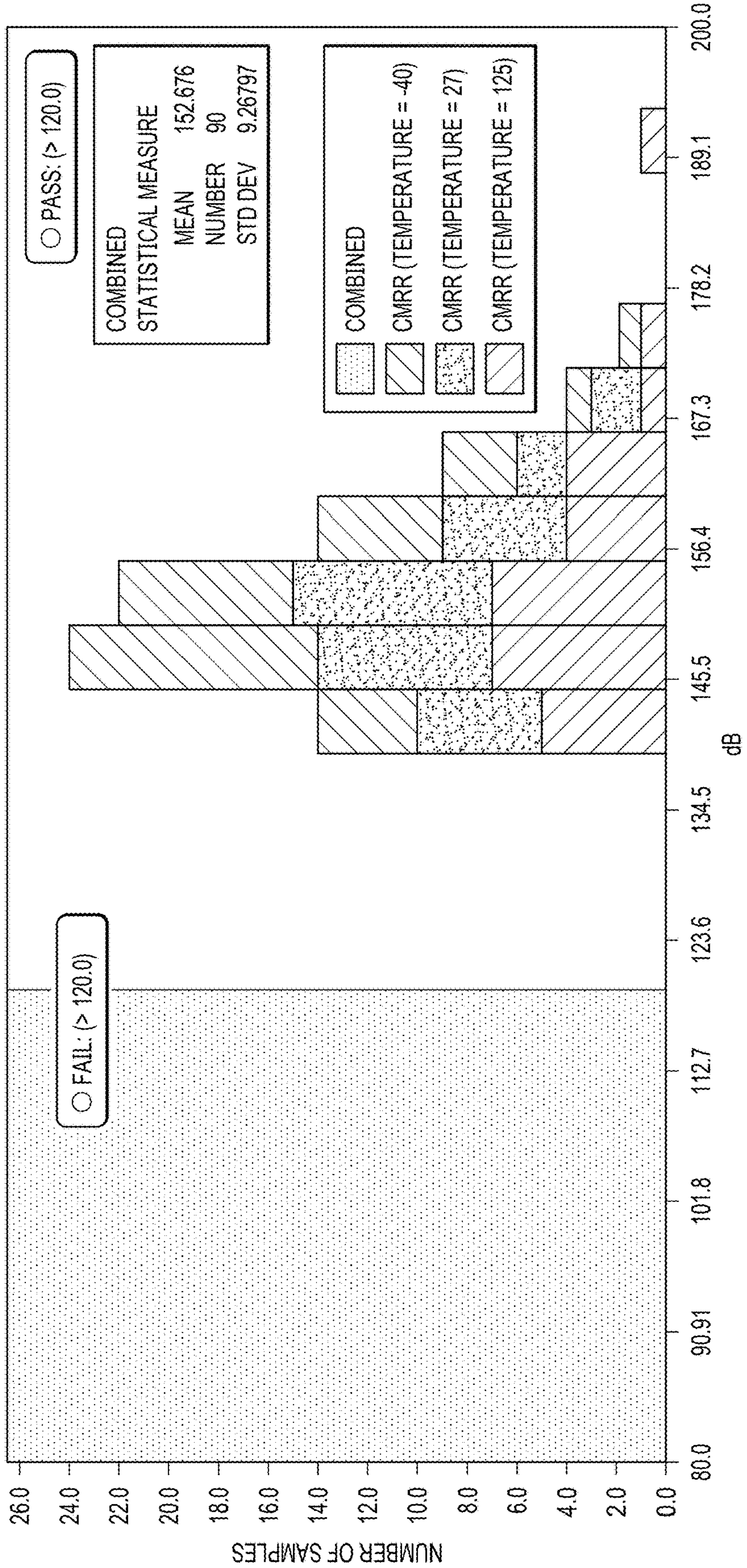
FIG. 7 is a graph illustrating the common mode rejection ratio corresponding to examples described herein.

FIG. 7 is an example graph 700 illustrating CMRR results using examples described herein. The x-axis of the graph 700 is the CMRR and the y-axis of the graph 700 is the number of samples that resulted in a particular CMRR. The graph 700 includes samples taken at different temperatures (e.g., −40 degrees Celsius, 27 degrees Celsius, and 125 degrees Celsius). As shown in the example graph 700, all of the samples produced a CMRR higher than 134.5 dB without using trim. The graph 700 illustrates that from the testing, the average CMRR was 152.676 dB from 90 samples with a standard deviation of 9.27. Output stages that utilize INAs result in a CMRR of about 80 dB. Accordingly, examples described herein have a better CMRR by 2 orders of magnitude. Also, ideally the current output impedance of the output stage is sufficiently high. For example, some standards or customers may require the current output impedance of an output stage to be over 100 Megaohms to ensure correct operation. Based on testing, the current output impedance of the output stage described herein is, at minimum, over 450 Megaohms, far better than the 100 Megaohm requirements. The average measured current output impedance tested for the output stage described herein was 61.23 Giga Ohms, with a standard deviation of 61.23 Giga Ohms and a maximum measured output impedance of 554.1 Giga Ohms.

One or more example manners of implementing the output stage 106 of FIG. 1 is illustrated in FIGS. 2-6. However, one or more of the elements, processes or devices illustrated in FIGS. 1-6 may be combined, divided, re-arranged, omitted, eliminated, or implemented in any other way.

Further, the output stage 106 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) or field programmable logic device(s) (FPLD(s)).

When reading any of the apparatus or system claims of this patent to cover a purely software or firmware implementation, the output stage 106 is hereby expressly defined to include a non-transitory computer readable storage device or storage disk such as a memory, a digital versatile disk (DVD), a compact disk (CD), a Blu-ray disk, etc., including the software or firmware. Further still, the controller circuitry 230 may include one or more elements, processes, or devices in addition to, or instead of, those illustrated in FIGS. 2-6, or may include more than one of any or all of the illustrated elements, processes, and devices. As used herein, the phrase "in communication," including variations thereof, encompasses direct communication or indirect communication through one or more intermediary components, and does not require direct physical (e.g., wired) communication or constant communication, but rather also includes selective communication at one or more of periodic intervals, scheduled intervals, aperiodic intervals, or one-time events.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

Descriptors "first," "second," "third," etc. are used herein to identify multiple elements or components which may be referred to separately. Unless otherwise specified or known based on their context of use, such descriptors do not impute any meaning of priority, physical order, or arrangement in a list, or ordering in time but are merely used as labels for referring to multiple elements or components separately for case of understanding the described examples. In some examples, the descriptor "first" may be used to refer to an element in the detailed description, while the same element may be referred to in a claim with a different descriptor such as "second" or "third." In such instances, such descriptors are used merely for ease of referencing multiple elements or components.

In the description and in the claims, the terms "including" and "having," and variants thereof are to be inclusive in a manner similar to the term "comprising" unless otherwise noted. Unless otherwise stated, "about," "approximately," or "substantially" preceding a value means+/−10 percent of the stated value. In another example, "about," "approximately," or "substantially" preceding a value means+/−5 percent of the stated value. IN another example, "about," "approximately," or "substantially" preceding a value means+/−1 percent of the stated value.

The terms "couple," "coupled," "couples," and variants thereof, as used herein, may cover connections, communications, or signal paths that enable a functional relationship consistent with this description. For example, if device A generates a signal to control device B to perform an action, if a first example device A is coupled to device B, or if a second example device A is coupled to device B through intervening component C if intervening component C does not substantially alter the functional relationship between device A and device B, such that device B is controlled by device A via the control signal generated by device A. Moreover, the terms "couple," "coupled", "couples", or variants thereof, includes an indirect or direct electrical or mechanical connection.

A device that is "configured to" perform a task or function may be configured (e.g., at least one of programmed or hardwired) at a time of manufacturing by a manufacturer to perform the function or may be configurable (or re-configurable) by a user after manufacturing to perform the function or other additional or alternative functions. The configuring may be through at least one firmware or software programming of the device, through a construction or layout of hardware components and interconnections of the device, or a combination thereof.

Although not all separately labeled in the FIGS. 1-6, components or elements of systems and circuits illustrated therein have one or more conductors or terminus that allow signals into or out of the components or elements. The conductors or terminus (or parts thereof) may be referred to herein as pins, pads, terminals (including input terminals, output terminals, reference terminals, and ground terminals, for instance), inputs, outputs, nodes, and interconnects.

As used herein, a "terminal" of a component, device, system, circuit, integrated circuit, or other electronic or semiconductor component, generally refers to a conductor such as a wire, trace, pin, pad, or other connector or interconnect that enables the component, device, system, etc., to electrically or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes may be shown. However, depending on particular circuitry or system topology, there may be more or fewer terminals and nodes. However, in some instances, "terminal," "node," "interconnect," "pad," and "pin" may be used interchangeably.

The term "or" as used, for example, in a form such as A, B, or C refers to any combination or subset of A, B, C such as (1) A alone, (2) B alone, (3) C alone, (4) A with B, (5) A with C, (6) B with C, or (7) A with B and with C.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein, integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Example methods, apparatus, systems, and articles of manufacture corresponding to an output stage of a digital-to-analog converter are described herein. Further examples and combinations thereof include the following: Example 1 includes an apparatus comprising a first transconductance amplifier having a first output and a second output, an amplifier having a first input, a second input, and an output, the first input of the amplifier coupled to the first output of the first transconductance amplifier, the second input of the amplifier coupled to the second output of the first transconductance amplifier, a resistor having a first terminal and a second terminal, the first terminal of the resistor coupled to the output of the amplifier, and a second transconductance amplifier having a first input, a second input, a first output, and a second output, the first input of the second transconductance amplifier coupled to the second terminal of the resistor, the second input of the second transconductance amplifier coupled to the output of the amplifier and the first terminal of the resistor, the first output of the second transconductance amplifier coupled to the first output of the first transconductance amplifier and the first input of the amplifier, the second output of the second transconductance amplifier coupled to the second output of the first transconductance amplifier and the second input of the amplifier.

Example 2 includes the apparatus of example 1, wherein the resistor is a first resistor, further including a second resistor having a first terminal and a second terminal, the first terminal of the second resistor coupled to the first output of the first transconductance amplifier, the first input of the amplifier, and the first output of the second transconductance amplifier, the second terminal of the second resistor coupled to a common terminal, and a third resistor having a first terminal and a second terminal, the first terminal of the third resistor coupled to the second output of the first transconductance amplifier, the second input of the amplifier, and the second output of the second transconductance amplifier, the second terminal of the third resistor coupled to the common terminal.

Example 3 includes the apparatus of example 1, wherein the first transconductance amplifier further has a first input and a second input, further including a digital-to-analog converter (DAC) having an input and an output, the output of the DAC coupled to the first input of the first transconductance amplifier, and a processor having a first output and a second output, the first output of the processor coupled to the input of the DAC, the second output of the processor coupled to the second input of the first transconductance amplifier.

Example 4 includes the apparatus of example 1, wherein the resistor is a first resistor, the second transconductance amplifier including a first sense amplifier having a first input, a second input, and an output, the second input being the first input of the second transconductance amplifier, a first transistor having a first current terminal, a second current terminal, and a control terminal, the first current terminal of the first transistor coupled to the second input of the first sense amplifier, the second current terminal of the first transistor being the first output of the second transconductance amplifier, the control terminal of the first transistor coupled to the output of the first sense amplifier, a second sense amplifier having a first input, a second input, and an output, the second input being the second input of the transconductance amplifier, a second transistor having a first current terminal, a second current terminal, and a control terminal, the first current terminal of the second transistor coupled to the first input of the second sense amplifier, the second current terminal of the first transistor being the second output of the second transconductance amplifier, the control terminal of the second transistor coupled to the output of the second sense amplifier, and a second resistor having a first terminal and a second terminal, the first terminal of the second resistor coupled to the first current terminal of the first transistor and the first input of the first sense amplifier, the second terminal of the second resistor coupled to the first current terminal of the second transistor and the first input of the second sense amplifier.

Example 5 includes the apparatus of example 4, wherein the second transconductance amplifier further includes a first current source having an output, the output of the first current source coupled to the first current terminal of the first transistor, the first input of the first sense amplifier, and the first terminal of the second resistor, and a second current source having an output, the output of the second current source coupled to the first current terminal of the second transistor, the first input of the second sense amplifier, and the second terminal of the second resistor.

Example 6 includes the apparatus of example 5, wherein the first current source has an input and the second current source has an input, the second transconductance amplifier further including a first switch having a first terminal, a second terminal, and a control terminal, the first terminal of the first switch coupled to a supply terminal, the second terminal of the first switch coupled to the input of the first current source, and a second switch having a first terminal, a second terminal, and a control terminal, the first terminal of the second switch coupled to the supply terminal, the second terminal of the second switch coupled to the input of the second current source.

Example 7 includes the apparatus of example 1, wherein the first input of the first transconductance amplifier is a non-inverting input, the second input of the transconductance amplifier is an inverting input, the first input of the amplifier is an inverting input, the second input of the amplifier is a non-inverting input, the first input of the second transconductance amplifier is a non-inverting input, and the second input of the second transconductance amplifier is an inverting input.

Example 8 includes an apparatus comprising a positive voltage supply terminal, a negative voltage supply terminal, a first transconductance amplifier having a first output and a second output, an amplifier having a first input, a second input, and an output, the first input of the amplifier coupled to the first output of the first transconductance amplifier, the second input of the amplifier coupled to the second output of the first transconductance amplifier, a resistor having a first terminal and a second terminal, the first terminal of the resistor coupled to the output of the amplifier, and a second transconductance amplifier having a first input, a second input, a first output, and a second output, the first input of the second transconductance amplifier coupled to the second terminal of the resistor and the positive voltage supply terminal, the second input of the second transconductance amplifier coupled to the negative voltage supply terminal, the first output of the second transconductance amplifier coupled to the first output of the first transconductance amplifier and the first input of the amplifier, the second output of the second transconductance amplifier coupled to the second output of the first transconductance amplifier and the second input of the amplifier.

Example 9 includes the apparatus of example 8, wherein the resistor is a first resistor, further including a second resistor having a first terminal and a second terminal, the first terminal of the second resistor coupled to the first output of the first transconductance amplifier, the first input of the amplifier, and the first output of the second transconductance amplifier, the second terminal of the second resistor coupled to a common terminal, and a third resistor having a first terminal and a second terminal, the first terminal of the third resistor coupled to the second output of the first transconductance amplifier, the second input of the amplifier, and the second output of the second transconductance amplifier, the second terminal of the third resistor coupled to the common terminal.

Example 10 includes the apparatus of example 8, wherein the first transconductance amplifier further has a first input and a second input, further including a digital-to-analog converter (DAC) having an input and an output, the output of the DAC coupled to the first input of the first transconductance amplifier, and a processor having a first output and a second output, the first output of the processor coupled to the input of the DAC, the second output of the processor coupled to the second input of the first transconductance amplifier.

Example 11 includes the apparatus of example 8, wherein the resistor is a first resistor, the second transconductance amplifier including a first sense amplifier having a first input, a second input, and an output, the second input being the first input of the second transconductance amplifier, a first transistor having a first current terminal, a second current terminal, and a control terminal, the first current terminal of the first transistor coupled to the second input of the first sense amplifier, the second current terminal of the first transistor being the first output of the second transconductance amplifier, the control terminal of the first transistor coupled to the output of the first sense amplifier, a second sense amplifier having a first input, a second input, and an output, the second input being the second input of the transconductance amplifier, a second transistor having a first current terminal, a second current terminal, and a control terminal, the first current terminal of the second transistor coupled to the first input of the second sense amplifier, the second current terminal of the first transistor being the second output of the second transconductance amplifier, the control terminal of the second transistor coupled to the output of the second sense amplifier, and a second resistor having a first terminal and a second terminal, the first terminal of the second resistor coupled to the first current terminal of the first transistor and the first input of the first sense amplifier, the second terminal of the second resistor coupled to the first current terminal of the second transistor and the first input of the second sense amplifier.

Example 12 includes the apparatus of example 11, wherein the second transconductance amplifier further includes a first current source having an output, the output of the first current source coupled to the first current terminal of the first transistor, the first input of the first sense amplifier, and the first terminal of the second resistor, and a second current source having an output, the output of the second current source coupled to the first current terminal of the second transistor, the first input of the second sense amplifier, and the second terminal of the second resistor.

Example 13 includes the apparatus of example 12, wherein the first current source has an input and the second current source has an input, the second transconductance amplifier further including a first switch having a first terminal, a second terminal, and a control terminal, the first terminal of the first switch coupled to a supply terminal, the second terminal of the first switch coupled to the input of the first current source, and a second switch having a first terminal, a second terminal, and a control terminal, the first terminal of the second switch coupled to the supply terminal, the second terminal of the second switch coupled to the input of the second current source.

Example 14 includes the apparatus of example 8, wherein the first input of the first transconductance amplifier is a non-inverting input, the second input of the transconductance amplifier is an inverting input, the first input of the amplifier is an inverting input, the second input of the amplifier is a non-inverting input, the first input of the second transconductance amplifier is a non-inverting input, and the second input of the second transconductance amplifier is an inverting input.

Example 15 includes an apparatus comprising a first switch having a first terminal and a second terminal, a second switch having a first terminal and a second terminal, a third switch having a first terminal and a second terminal, a fourth switch having a first terminal and a second terminal, a fifth switch having a first terminal and a second terminal, the second terminal coupled to a common terminal, a first transconductance amplifier having a first output and a second output, the first output of the first transconductance amplifier coupled to the second terminal of the second switch and the second terminal of the third switch, the second output of the first transconductance amplifier coupled to the second terminal of the first switch and the second terminal of the fourth switch, an amplifier having a first input, a second input, and an output, the first input of the amplifier coupled to the first output of the first transconductance amplifier, second terminal of the second switch, and the second terminal of the third switch, the second input of the amplifier coupled to the second output of the first transconductance amplifier, the second terminal of the first switch, and the second terminal of the fourth switch, a resistor having a first terminal and a second terminal, the first terminal of the resistor coupled to the output of the amplifier, and a second transconductance amplifier having a first input, a second input, a first output, and a second output, the first input of the second transconductance amplifier coupled to the second terminal of the resistor, the second input of the second transconductance amplifier coupled to the output of the amplifier and the first terminal of the resistor, the first output of the second transconductance amplifier coupled to the first terminal of the first switch, the second output of the second transconductance amplifier coupled to the first terminal of the second switch, and a third transconductance amplifier having a first input, a second input, a first output, and a second output, the first input of the third transconductance amplifier coupled to the second terminal of the resistor and the first input of the second transconductance amplifier, the second input of the third transconductance amplifier coupled to the first terminal of the fifth switch, the first output of the third transconductance amplifier coupled to first terminal of the fourth switch, the second output of the third transconductance amplifier coupled to the first terminal of the third switch.

Example 16 includes the apparatus of example 15, wherein the amplifier is a current input amplifier.

Example 17 includes the apparatus of example 15, wherein the first transconductance amplifier further has a first input and a second input, further including a digital-to-analog converter (DAC) having an input and an output, the output of the DAC coupled to the first input of the first transconductance amplifier, and a processor having a first output and a second output, the first output of the processor coupled to the input of the DAC, the second output of the processor coupled to the second input of the first transconductance amplifier.

Example 18 includes the apparatus of example 15, wherein the resistor is a first resistor, the second transconductance amplifier including a first sense amplifier having a first input, a second input, and an output, the second input being the first input of the second transconductance amplifier, a first transistor having a first current terminal, a second current terminal, and a control terminal, the first current terminal of the first transistor coupled to the second input of the first sense amplifier, the second current terminal of the first transistor being the first output of the second transconductance amplifier, the control terminal of the first transistor coupled to the output of the first sense amplifier, a second sense amplifier having a first input, a second input, and an output, the second input being the second input of the transconductance amplifier, a second transistor having a first current terminal, a second current terminal, and a control terminal, the first current terminal of the second transistor coupled to the first input of the second sense amplifier, the second current terminal of the first transistor being the second output of the second transconductance amplifier, the control terminal of the second transistor coupled to the output of the second sense amplifier, and a second resistor having a first terminal and a second terminal, the first terminal of the second resistor coupled to the first current terminal of the first transistor and the first input of the first sense amplifier, the second terminal of the second resistor coupled to the first current terminal of the second transistor and the first input of the second sense amplifier.

Example 19 includes the apparatus of example 18, wherein the second transconductance amplifier further includes a first current source having an input and an output, the input of the first current source coupled to a supply terminal, the output of the first current source coupled to the first current terminal of the first transistor, the first input of the first sense amplifier, and the first terminal of the second resistor, and a second current source having an input and an output, the input of the second current source coupled to the supply terminal, the output of the second current source coupled to the first current terminal of the second transistor, the first input of the second sense amplifier, and the second terminal of the second resistor.

Example 20 includes the apparatus of example 18, wherein the first input of the first transconductance amplifier is a non-inverting input, the second input of the transconductance amplifier is an inverting input, the first input of the amplifier is an inverting input, the second input of the amplifier is a non-inverting input, the first input of the second transconductance amplifier is a non-inverting input, the second input of the second transconductance amplifier is an inverting input, the first input of the third transconductance amplifier is a non-inverting input, and the second input of the third transconductance amplifier is an inverting input.

From the foregoing, it will be appreciated that example systems, apparatus, articles of manufacture, and methods have been described corresponding to an output stage of a digital-to-analog converter. Described systems, apparatus, articles of manufacture, and methods result in an output stage with increased CMRR, low noise, and high linearity without requiring large, complex, or expensive components or without complex and expensive trim. Thus, described systems, apparatus, articles of manufacture, and methods are accordingly directed to one or more improvement(s) in the operation of a machine such as a computer or other electronic device.

Modifications are possible in the described examples, and other examples are possible, within the scope of the claims.

What is claimed is:

1. An apparatus comprising:

a first transconductance amplifier having a first output and a second output;

an amplifier having a first input, a second input, and an output, the first input of the amplifier coupled to the first output of the first transconductance amplifier, the second input of the amplifier coupled to the second output of the first transconductance amplifier;

a resistor having a first terminal and a second terminal, the first terminal of the resistor coupled to the output of the amplifier; and a second transconductance amplifier having a first input, a second input, a first output, and a second output, the first input of the second transconductance amplifier coupled to the second terminal of the resistor, the second input of the second transconductance amplifier coupled to the output of the amplifier and the first terminal of the resistor, the first output of the second transconductance amplifier coupled to the first output of the first transconductance amplifier and the first input of the amplifier, the second output of the second transconductance amplifier coupled to the second output of the first transconductance amplifier and the second input of the amplifier.

2. The apparatus of claim 1, wherein the resistor is a first resistor, further including:

a second resistor having a first terminal and a second terminal, the first terminal of the second resistor coupled to the first output of the first transconductance amplifier, the first input of the amplifier, and the first output of the second transconductance amplifier, the second terminal of the second resistor coupled to a common terminal; and a third resistor having a first terminal and a second terminal, the first terminal of the third resistor coupled to the second output of the first transconductance amplifier, the second input of the amplifier, and the second output of the second transconductance amplifier, the second terminal of the third resistor coupled to the common terminal.

3. The apparatus of claim 1, wherein the first transconductance amplifier further has a first input and a second input, further including:

a digital-to-analog converter (DAC) having an input and an output, the output of the DAC coupled to the first input of the first transconductance amplifier; and a processor having a first output and a second output, the first output of the processor coupled to the input of the DAC, the second output of the processor coupled to the second input of the first transconductance amplifier.

4. The apparatus of claim 1, wherein the resistor is a first resistor, the second transconductance amplifier including:

a first sense amplifier having a first input, a second input, and an output, the second input being the first input of the second transconductance amplifier;

a first transistor having a first current terminal, a second current terminal, and a control terminal, the first current terminal of the first transistor coupled to the second input of the first sense amplifier, the second current terminal of the first transistor being the first output of the second transconductance amplifier, the control terminal of the first transistor coupled to the output of the first sense amplifier;

a second sense amplifier having a first input, a second input, and an output, the second input being the second input of the transconductance amplifier;

a second transistor having a first current terminal, a second current terminal, and a control terminal, the first current terminal of the second transistor coupled to the first input of the second sense amplifier, the second current terminal of the first transistor being the second output of the second transconductance amplifier, the control terminal of the second transistor coupled to the output of the second sense amplifier; and a second resistor having a first terminal and a second terminal, the first terminal of the second resistor coupled to the first current terminal of the first transistor and the first input of the first sense amplifier, the second terminal of the second resistor coupled to the first current terminal of the second transistor and the first input of the second sense amplifier.

5. The apparatus of claim 4, wherein the second transconductance amplifier further includes:

a first current source having an output, the output of the first current source coupled to the first current terminal of the first transistor, the first input of the first sense amplifier, and the first terminal of the second resistor; and a second current source having an output, the output of the second current source coupled to the first current terminal of the second transistor, the first input of the second sense amplifier, and the second terminal of the second resistor.

6. The apparatus of claim 5, wherein the first current source has an input and the second current source has an input, the second transconductance amplifier further including:

a first switch having a first terminal, a second terminal, and a control terminal, the first terminal of the first switch coupled to a supply terminal, the second terminal of the first switch coupled to the input of the first current source; and a second switch having a first terminal, a second terminal, and a control terminal, the first terminal of the second switch coupled to the supply terminal, the second terminal of the second switch coupled to the input of the second current source.

7. The apparatus of claim 1, wherein the first input of the first transconductance amplifier is a non-inverting input, the second input of the transconductance amplifier is an inverting input, the first input of the amplifier is an inverting input, the second input of the amplifier is a non-inverting input, the first input of the second transconductance amplifier is a non-inverting input, and the second input of the second transconductance amplifier is an inverting input.

8. An apparatus comprising:

a positive voltage supply terminal;

a negative voltage supply terminal;

a first transconductance amplifier having a first output and a second output;

an amplifier having a first input, a second input, and an output, the first input of the amplifier coupled to the first output of the first transconductance amplifier, the second input of the amplifier coupled to the second output of the first transconductance amplifier;

a resistor having a first terminal and a second terminal, the first terminal of the resistor coupled to the output of the amplifier; and a second transconductance amplifier having a first input, a second input, a first output, and a second output, the first input of the second transconductance amplifier coupled to the second terminal of the resistor and the positive voltage supply terminal, the second input of the second transconductance amplifier coupled to the negative voltage supply terminal, the first output of the second transconductance amplifier coupled to the second output of the first transconductance amplifier and the second input of the amplifier, the second output of the second transconductance amplifier coupled to the first output of the first transconductance amplifier and the first input of the amplifier the second output of the first transconductance amplifier and the second input of the amplifier.

9. The apparatus of claim 8, wherein the resistor is a first resistor, further including:

a second resistor having a first terminal and a second terminal, the first terminal of the second resistor coupled to the first output of the first transconductance amplifier, the first input of the amplifier, and the second output of the second transconductance amplifier, the second terminal of the second resistor coupled to a common terminal; and a third resistor having a first terminal and a second terminal, the first terminal of the third resistor coupled to the second output of the first transconductance amplifier, the second input of the amplifier, and the first output of the second transconductance amplifier, the second terminal of the third resistor coupled to the common terminal.

10. The apparatus of claim 8, wherein the first transconductance amplifier further has a first input and a second input, further including:

a digital-to-analog converter (DAC) having an input and an output, the output of the DAC coupled to the first input of the first transconductance amplifier; and a processor having a first output and a second output, the first output of the processor coupled to the input of the DAC, the second output of the processor coupled to the second input of the first transconductance amplifier.

11. The apparatus of claim 8, wherein the resistor is a first resistor, the second transconductance amplifier including:

a first sense amplifier having a first input, a second input, and an output, the second input being the first input of the second transconductance amplifier;

a first transistor having a first current terminal, a second current terminal, and a control terminal, the first current terminal of the first transistor coupled to the second input of the first sense amplifier, the second current terminal of the first transistor being the second output of the second transconductance amplifier, the control terminal of the first transistor coupled to the output of the first sense amplifier;

a second sense amplifier having a first input, a second input, and an output, the second input being the second input of the transconductance amplifier;

a second transistor having a first current terminal, a second current terminal, and a control terminal, the first current terminal of the second transistor coupled to the first input of the second sense amplifier, the second current terminal of the first transistor being the first output of the second transconductance amplifier, the control terminal of the second transistor coupled to the output of the second sense amplifier; and a second resistor having a first terminal and a second terminal, the first terminal of the second resistor coupled to the first current terminal of the first transistor and the first input of the first sense amplifier, the second terminal of the second resistor coupled to the first current terminal of the second transistor and the first input of the second sense amplifier.

12. The apparatus of claim 11, wherein the second transconductance amplifier further includes:

a first current source having an output, the output of the first current source coupled to the first current terminal of the first transistor, the first input of the first sense amplifier, and the first terminal of the second resistor; and a second current source having an output, the output of the second current source coupled to the first current terminal of the second transistor, the first input of the second sense amplifier, and the second terminal of the second resistor.

13. The apparatus of claim 12, wherein the first current source has an input and the second current source has an input, the second transconductance amplifier further including:

a first switch having a first terminal, a second terminal, and a control terminal, the first terminal of the first switch coupled to a supply terminal, the second terminal of the first switch coupled to the input of the first current source; and a second switch having a first terminal, a second terminal, and a control terminal, the first terminal of the second switch coupled to the supply terminal, the second terminal of the second switch coupled to the input of the second current source.

14. The apparatus of claim 8, wherein the first input of the first transconductance amplifier is a non-inverting input, the second input of the transconductance amplifier is an inverting input, the first input of the amplifier is an inverting input, the second input of the amplifier is a non-inverting input, the first input of the second transconductance amplifier is a non-inverting input, and the second input of the second transconductance amplifier is an inverting input.

15. An apparatus comprising:

a first switch having a first terminal and a second terminal;

a second switch having a first terminal and a second terminal;

a third switch having a first terminal and a second terminal;

a fourth switch having a first terminal and a second terminal;

a fifth switch having a first terminal and a second terminal, the second terminal coupled to a common terminal;

a first transconductance amplifier having a first output and a second output, the first output of the first transconductance amplifier coupled to the second terminal of the first switch and the second terminal of the third switch, the second output of the first transconductance amplifier coupled to the second terminal of the second switch and the second terminal of the fourth switch;

an amplifier having a first input, a second input, and an output, the first input of the amplifier coupled to the first output of the first transconductance amplifier, second terminal of the first switch, and the second terminal of the third switch, the second input of the amplifier coupled to the second output of the first transconductance amplifier, the second terminal of the second switch, and the second terminal of the fourth switch;

a resistor having a first terminal and a second terminal, the first terminal of the resistor coupled to the output of the amplifier; and a second transconductance amplifier having a first input, a second input, a first output, and a second output, the first input of the second transconductance amplifier coupled to the second terminal of the resistor, the second input of the second transconductance amplifier coupled to the output of the amplifier and the first terminal of the resistor, the first output of the second transconductance amplifier coupled to the first terminal of the first switch, the second output of the second transconductance amplifier coupled to the first terminal of the second switch; and a third transconductance amplifier having a first input, a second input, a first output, and a second output, the first input of the third transconductance amplifier coupled to the second terminal of the resistor and the first input of the second transconductance amplifier, the second input of the third transconductance amplifier coupled to the first terminal of the fifth switch, the first output of the third transconductance amplifier coupled to first terminal of the fourth switch, the second output of the third transconductance amplifier coupled to the first terminal of the third switch.

16. The apparatus of claim 15, wherein the amplifier is a current input amplifier.

17. The apparatus of claim 15, wherein the first transconductance amplifier further has a first input and a second input, further including:

a digital-to-analog converter (DAC) having an input and an output, the output of the DAC coupled to the first input of the first transconductance amplifier; and a processor having a first output and a second output, the first output of the processor coupled to the input of the DAC, the second output of the processor coupled to the second input of the first transconductance amplifier.

18. The apparatus of claim 15, wherein the resistor is a first resistor, the second transconductance amplifier including:

a first sense amplifier having a first input, a second input, and an output, the second input being the first input of the second transconductance amplifier;

a first transistor having a first current terminal, a second current terminal, and a control terminal, the first current terminal of the first transistor coupled to the second input of the first sense amplifier, the second current terminal of the first transistor being the first output of the second transconductance amplifier, the control terminal of the first transistor coupled to the output of the first sense amplifier;

a second sense amplifier having a first input, a second input, and an output, the second input being the second input of the transconductance amplifier;

a second transistor having a first current terminal, a second current terminal, and a control terminal, the first current terminal of the second transistor coupled to the first input of the second sense amplifier, the second current terminal of the first transistor being the second output of the second transconductance amplifier, the control terminal of the second transistor coupled to the output of the second sense amplifier; and a second resistor having a first terminal and a second terminal, the first terminal of the second resistor coupled to the first current terminal of the first transistor and the first input of the first sense amplifier, the second terminal of the second resistor coupled to the first current terminal of the second transistor and the first input of the second sense amplifier.

19. The apparatus of claim 18, wherein the second transconductance amplifier further includes:

a first current source having an input and an output, the input of the first current source coupled to a supply terminal, the output of the first current source coupled to the first current terminal of the first transistor, the first input of the first sense amplifier, and the first terminal of the second resistor; and a second current source having an input and an output, the input of the second current source coupled to the supply terminal, the output of the second current source coupled to the first current terminal of the second transistor, the first input of the second sense amplifier, and the second terminal of the second resistor.

20. The apparatus of claim 18, wherein the first input of the first transconductance amplifier is a non-inverting input, the second input of the transconductance amplifier is an inverting input, the first input of the amplifier is an inverting input, the second input of the amplifier is a non-inverting input, the first input of the second transconductance amplifier is a non-inverting input, the second input of the second transconductance amplifier is an inverting input, the first input of the third transconductance amplifier is a non-inverting input, and the second input of the third transconductance amplifier is an inverting input.

* * * * *